United States Patent [19]
Uchida et al.

[11] Patent Number: 6,143,406
[45] Date of Patent: Nov. 7, 2000

[54] MAGNETIC COMPOSITE TAPE FOR INHIBITING RADIATION NOISE AND RADIATION NOISE INHIBITING COMPONENT USING SAME

[75] Inventors: Katsuyuki Uchida, Hikone; Masami Sugitani, Fukui-ken, both of Japan

[73] Assignee: Murata Manufacturing Co., Ltd., Japan

[21] Appl. No.: 09/252,518

[22] Filed: Feb. 18, 1999

[30]  Foreign Application Priority Data

Mar. 6, 1998 [JP] Japan .................................. 10-055573

[51] Int. Cl.⁷ ...................................................... B32B 5/16
[52] U.S. Cl. ........................... 428/336; 427/127; 427/128;
428/332; 428/339; 428/354; 428/402; 428/457;
428/693; 428/699; 428/900; 428/923; 428/926;
428/928; 428/929
[58] Field of Search ..................................... 427/127, 128;
428/336, 332, 339, 354, 402, 457, 693,
699, 900, 923, 926, 929, 928

[56]  References Cited

FOREIGN PATENT DOCUMENTS

| | | |
|---|---|---|
| 0597324 A1 | 10/1993 | European Pat. Off. . |
| 69 41 807 | 10/1969 | Germany . |
| 41 32 985 A1 | 5/1992 | Germany . |
| 44 07 838 C2 | 9/1994 | Germany . |
| 97/04467 | 7/1996 | WIPO . |

*Primary Examiner*—Bernard Pianalto
*Attorney, Agent, or Firm*—Keating & Bennett, LLP

[57]  ABSTRACT

A magnetic composite tape for inhibiting radiation noise and a radiation noise inhibiting component using such a magnetic composite tape which can be easily attached to a cable and has a high radiation noise inhibiting effect are provided. A magnetic composite tape for radiation noise control has an elongated shape, and includes a magnetic band member and a metal foil provided on the surface of the magnetic band member. The magnetic band member includes a rubber or a flexible resin and ferrite magnetic powders. One side of the metal foil in a width direction projects from one side of the magnetic band member. An adhesive is applied on the other surface of the magnetic band member. The composite tape is wound and attached with the adhesive applied on the other surface of the magnetic band member at a location on a cable, such as an interface cable, a head cable (power supply cable) or the like, which is to located close to an electronic apparatus containing an oscillation circuit. The composite tape is wound such that the projected left side of the metal foil can overlap the adjacent right side of the metal foil.

20 Claims, 3 Drawing Sheets

MAGNETIC COMPOSITE TAPE FOR INHIBITING RADIATION NOISE AND RADIATION NOISE INHIBITING COMPONENT USING SAME

BACKGROUND OF THE INVENTION

1. Field of Invention

The present invention relates to a magnetic composite tape for inhibiting radiation noise and a radiation noise inhibiting component using such a magnetic composite tape.

2. Description of Related Art

Conventionally, when suppressing noise radiated from an interface cable or a head cable (power supply cable), a ferrite ring core or a cylindrical resin member containing a ferrite (cylindrical magnetic member) are inserted into the cable to generate a common-mode impedance and the noise is suppressed due to the generation of such impedance. Moreover, apart from this, by winding a tape-like magnetic rubber onto a predetermined portion of the cable, common-mode impedance is generated as with the above-mentioned ferrite ring core, and the noise is further suppressed.

When the noise is suppressed using the ferrite ring core or the cylindrical resin containing a ferrite, an outer diameter R1 of the ferrite ring core or the like and an inner diameter R2 thereof have a relationship such that the common-mode impedance generated is proportional to (R1−R2)/(R1+R2) and is also proportional to the length of the ferrite ring core or the like. Therefore, in order to obtain a large common-mode impedance, the ferrite ring or the like must have a relatively large size. Moreover, even if a material which has a high initial permeability is used, the so-called "Snoek's limit" phenomenon occurs. With this phenomenon, there is a problem that permeability decreases at the high-frequency area and consequently, the common-mode impedance does not increase to the extent expected. Furthermore, it is known that the ferrite ring core or the like is covered with a conductive member and the conductive member is grounded, then, a radiation noise inhibiting effect can be improved. However, when using the ferrite ring core or the like, it is necessary to provide the conductive member with the ferrite core before connecting the cable with a connector.

When suppressing noise by using a tape-like magnetic rubber, in order to obtain a large noise suppression effect, it is necessary to increase the common-mode impedance by methods such as winding the tape-like magnetic rubber for many turns to achieve the desired thickness of the magnetic rubber or extending the length along which the magnetic rubber is wound on the cable. Moreover, it is known that a large radiation noise inhibiting effect can be obtained by winding the tape-like magnetic rubber onto the cable and accommodating the wound magnetic rubber in a conductive case. However, the provision of the tape-like magnetic rubber and that of the conductive case must be performed separately and requires very complicated assembling processes.

SUMMARY OF THE INVENTION

To overcome the problems described above, preferred embodiments of the present invention provide a magnetic composite tape for inhibiting radiation noise having a high radiation noise inhibiting effect and a structure that allows it to be easily and quickly fit onto the cable, and a radiation noise inhibiting component using such a magnetic composite tape.

According to one preferred embodiment of the present invention, a magnetic composite tape for inhibiting radiation noise includes a magnetic band member including magnetic powders and at least one of a rubber or a flexible resin and a metal foil having a width that is greater than the width of the magnetic band member, wherein the metal foil is integrally provided on a surface of the magnetic band member.

According to another preferred embodiment of the present invention, a magnetic composite tape for inhibiting radiation noise includes a magnetic band member including magnetic powders and at least one of a rubber or a flexible resin and a metal foil integrally provided on a surface of the magnetic band member, wherein one side of the metal foil in the width direction is spaced from one side of the magnetic band member and another side of the metal foil extends beyond another side of the magnetic band member.

Further, a radiation noise inhibiting component according to a preferred embodiment of the present invention includes a magnetic composite tape according to any one of the preferred embodiments described above, a cable covered with the magnetic composite tape at a predetermined portion of the peripheral surface thereof, and a conductive member grounding the metal foil of the magnetic composite tape.

An adhesive film is applied on the reverse side of the magnetic band member of the magnetic composite tape for inhibiting radiation noise. The metal foil of the magnetic composite tape for inhibiting radiation noise includes the metal material which may be made of at least any one of copper, nickel, or aluminium, for example, as a component.

Since the magnetic composite tape integrally provided with the magnetic band member and the metal foil is attached to the cable, the magnetic band member is covered with the metal foil and the tape together with the magnetic band member is mounted on the periphery of the cable. Moreover, even after connecting the cable with the connector, the magnetic composite tape can be easily attached to the cable.

Other features, details, advantages of preferred embodiments of the present invention will become apparent from the following description thereof with reference to the attached drawings described below.

DETAILED DESCRIPTION OF PREFERRED EMBODIMENTS

Figure 1:
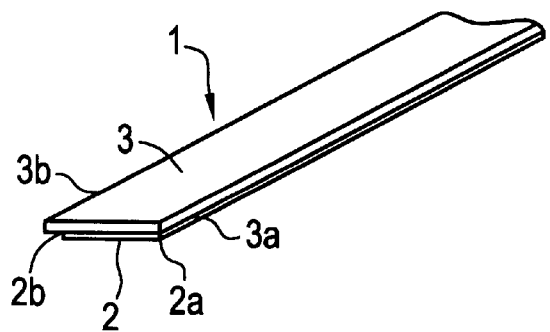
FIG. 1 is a perspective view showing a magnetic composite tape for inhibiting radiation noise according to a first preferred embodiment of the present invention.

According to the present invention, preferred embodiments of the magnetic composite tape for inhibiting radiation noise and the radiation noise inhibiting component using such a magnetic composite tape will be described below with reference to the attached drawings. In each preferred embodiment, the same reference numeral denotes the same component and the same portion.

As shown in FIG. 1, a magnetic composite tape 1 for inhibiting radiation noise preferably has an elongated shape, and preferably includes a magnetic band member 2 and a metal foil 3. The magnetic band 2 preferably includes a rubber or a flexible resin (for example, a polyethylene telephthalate, polyimide or the like) and ferrite magnetic powders. In the case of the first preferred embodiment, the magnetic band member 2 preferably includes a silicone system rubber and the ferrite magnetic powders. An amount of ferrite magnetic particles capable of providing a magnetic permeability of about 450 (measured frequency at 1 MHz), when the ferrite magnetic particles are used as a core, are comminuted so as to be formed into the ferrite magnetic powders having an average particle diameter preferably of about 15 micrometers. Then, about 85 wt % of the ferrite magnetic powders are mixed and kneaded with a silicone system rubber material, and a mixed material obtained is formed into the magnetic band member 2 having a thickness of about 0.8 mm and a width of about 20 mm, by extrusion molding.

On the surface of the magnetic band member 2, the metal foil 3 is integrally attached thereto via an adhesive. The metal foil 3 includes the metal material including a copper, a nickel, aluminium, or alloys made thereof as a component. In the case of the first preferred embodiment, a copper foil having a thickness of about 15 micrometers and a width of about 23 mm is used as the metal foil 3. In FIG. 1, a right side 3a of the metal foil 3 in a width direction thereof is aligned and flush with a right side 2a of the magnetic band member 2 and a left side 3b of the metal foil 3 projects from and extends beyond a left side 2b of the magnetic band member 2 (in the case of the first preferred embodiment, the left side 3b projects by approximately 3 mm). Furthermore, the adhesive is applied onto the other side of the magnetic band member 2, i.e., onto a surface opposite to the surface on which the metal foil 3 is provided.

Figure 2:
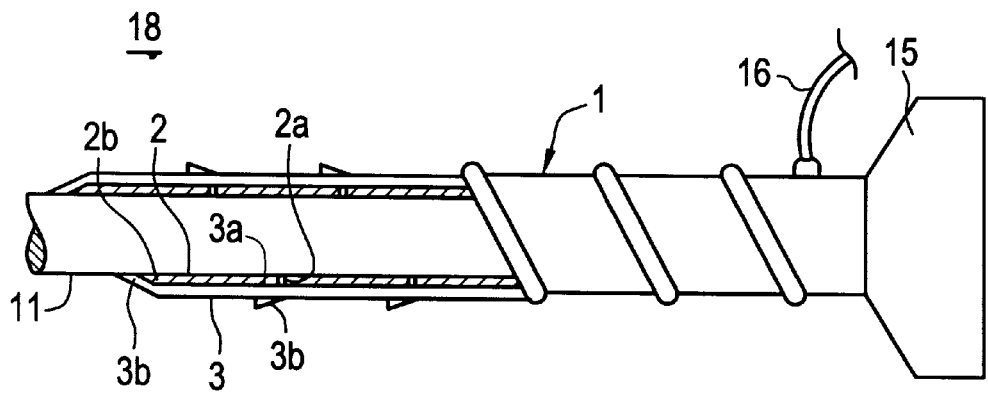
FIG. 2 is a partially cross-sectional view showing a radiation noise inhibiting component using the magnetic composite tape shown in FIG. 1.

As shown in FIG. 2, the magnetic composite tape 1 for inhibiting radiation noise having the above structure is wound and attached on a portion of a cable 11, such as an interface cable, a head cable (power supply cable) or the like, which is to be located close to an electronic apparatus containing an oscillation circuit, in other words, at a position of the cable 11 which is located close to the connector 15 to be connected to the cable 11. At this moment, the magnetic composite tape 1 is wound such that the extended left side 3b of the metal foil 3 overlaps with the right side 3a of the metal foil 3 which is adjacent to the left side 3b. The desired radiation noise inhibiting effect can be adjusted by increasing or decreasing the length of the composite tape 1 wound on the cable 11.

Furthermore, one end of a conductive wire 16 is electrically connected to the metal foil 3 preferably by soldering or by conductive adhesive. The other end of the conductive wire 16 is electrically connected to a ground of the electronic apparatus. In this way, the radiation noise inhibiting component 18 including the magnetic composite tape 1, the cable 11, and the conductive wire 16 can be obtained.

As described above, since the composite tape 1 is wound and attached on the cable 11, even after connecting the connector 15 to the cable 11, the composite tape 1 can be easily attached on the cable 11. Since the composite tape 1 including the integrally provided the magnetic band member 2 and the metal foil 3 is used, the outer surface of the magnetic band member 2 can be covered with the metal foil 3 and together with the magnetic band member 2 can be wound on the cable 11. Thus, the process of attaching the magnetic member and the conductive member with the cable is greatly simplified as compared to the conventional method.

The magnetic band member 2 wound on the outer circumferential surface of the cable 11 can have the same effect as a cylindrical magnetic member can, the common-mode impedance is generated and the noise can be suppressed. Moreover, since the projected left side 3b of the metal foil 3 overlaps with the adjacent right side 3a of the metal foil 3, the metal foil 3 can cover the outer circumferential surface of the magnetic band member 2 wound onto the cable 11 without any gaps, hence, a large radiation noise inhibiting effect can be obtained. The metal foil 3 is electrically connected to the ground of the apparatus through the conductive wire 16, and an even greater radiation noise inhibiting effect can be obtained.

Figure 3:
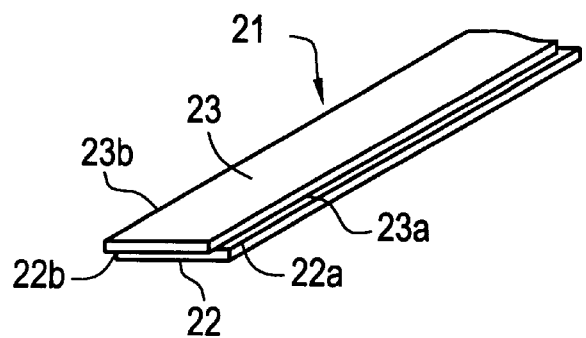
FIG. 3 is a perspective view showing a magnetic composite tape for inhibiting radiation noise according to a second preferred embodiment of the present invention.

As shown in FIG. 3, a magnetic composite tape 21 for radiation noise control has an elongated shape. The magnetic composite tape 21 includes a magnetic band member 22 and a metal foil 23. The metal foil 23 is integrally attached on the surface of the magnetic band member 22 via adhesive. A right side 23a of the metal foil 23 in a width direction is not flush with but is spaced from a right side 22a of the magnetic band member 22 and a left side 23b of the metal foil 23 projects from and extends beyond a left side 22b of the magnetic band member 22. The right side 22a of the magnetic band member 22 projects from and extends beyond the right side 23a of the metal foil 23. Furthermore, the adhesive is applied onto the other side of the magnetic band member 22, i.e., onto a surface opposite to the surface on which the metal foil 23 is provided.

Figure 4:
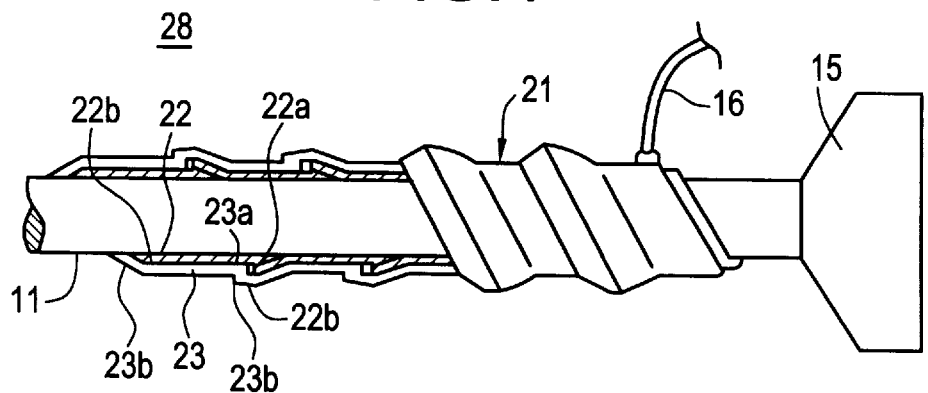
FIG. 4 is a partially cross-sectional view showing a radiation noise inhibiting component using the magnetic composite tape shown in FIG. 3.

As shown in FIG. 4, the magnetic composite tape 21 for radiation noise control including the above structure is wound and attached on the portion of the cable 11 which is located close to the electronic apparatus containing the oscillation circuit. The composite tape 21 is wound such that the extended left side 23b of the metal foil 23 overlaps the adjacent right side 23a of the metal foil 23 and together with the left side 22b of the magnetic band member 22 overlaps the adjacent right side 22a (that is, an upper surface of the magnetic band member 22 which is extended beyond and exposed from the metal foil 23) of the magnetic band member 22. The desired radiation noise inhibiting effect can be easily adjusted by increasing or decreasing the length of the composite tape 21 wound on the cable 11.

Furthermore, one end of the conductive wire 16 is electrically connected to the metal foil 23 preferably by soldering or by conductive adhesive. The other end of the conductive wire 16 is electrically connected to the ground of the electronic apparatus. In this way, the radiation noise inhibiting component 28 including the magnetic composite tape 21, the cable 11, and the conductive wire 16 is provided.

The composite tape 21 and the radiation noise inhibiting component 28 have the same effect as the composite tape 1 of the first preferred embodiment. Since the left side 22b of the magnetic band member 22 overlaps with the adjacent right side 22a of the magnetic band member 22, the magnetic band member 22 is wound onto the cable 11 without any gaps and the magnetic circuit formed by the magnetic band member 22 is not divided, thus the noise inhibiting effect can be stably and reliably obtained.

Figure 5:
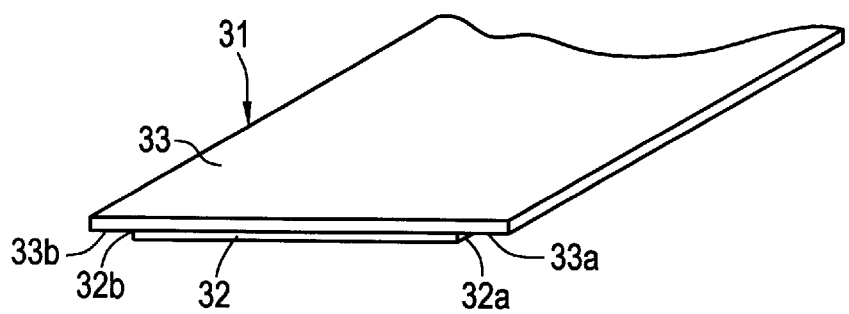
FIG. 5 is a perspective view showing a magnetic composite tape for inhibiting radiation noise according to a third preferred embodiment of the present invention.

As shown in FIG. 5, a magnetic composite tape 31 for inhibiting radiation noise preferably has an elongated shape. The magnetic composite tape 31 includes a magnetic band member 32 and a metal foil 33. In the case of a third preferred embodiment, the magnetic band member 32 preferably includes a silicone system rubber and ferrite magnetic powders. The amount of ferrite magnetic particles capable of providing the magnetic permeability of about 450 (measured frequency at 1 MHz), when the ferrite magnetic particles preferably used as the core, are comminuted so as to be formed into the ferrite magnetic powders having the average particle diameter of about 15 micrometers. Then, about 85 wt % of the ferrite magnetic powders is mixed and kneaded with the silicone system rubber material, and the mixed material obtained is formed into the magnetic band member 32 having a thickness of about 0.8 mm and a width of about 30 mm, by extrusion molding.

On the surface of the magnetic band member 32, the metal foil 33 is integrally attached via adhesive. In the case of the third preferred embodiment, a copper foil having a thickness of about 15 micrometers and a width of about 35 mm is used as the metal foil 33. Both sides 33a, 33b of the metal foil 33 in a width direction extend from both sides 32a, 32b of the magnetic band member 32. Furthermore, the adhesive is applied onto the other side of the magnetic band member 32, i.e., onto a surface opposite to the surface on which the metal foil 33 is provided.

Figure 6:
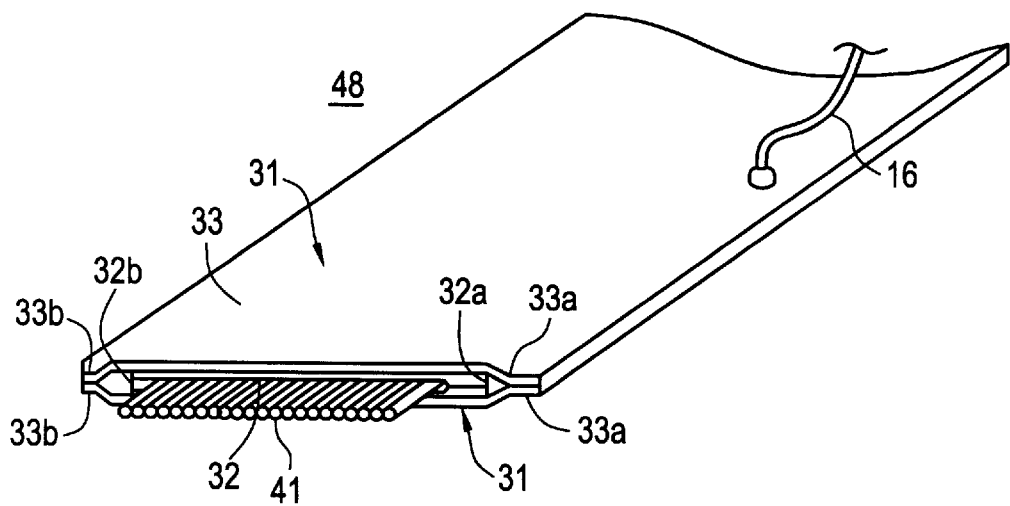
FIG. 6 is a perspective view showing a radiation noise inhibiting component using the magnetic composite tape shown in FIG. 5.

As shown in FIG. 6, two magnetic composite tapes 31 for inhibiting radiation noise which are cut along a predetermined length are prepared. The two composite tapes 31 are bonded to sandwich a flat interface cable 41 at a portion of the flat cable 41 which is to be located close to the electronic apparatus containing an oscillation circuit. Furthermore, one end of the conductive wire 16 is electrically connected to the metal foil 33 by soldering or by conductive adhesive and the other end of the conductive wire 16 is electrically connected to the ground of the electronic apparatus. In this way, the radiation noise inhibiting component 48 including the composite tape 31, the flat cable 41, and conductive wire 16 can be obtained.

As described above, since the composite tape 31 is bonded and attached so as to sandwich the flat cable 41, even after connecting the connector to the flat cable 41, the composite tape 31 can be easily attached to the flat cable 41. Further, since the magnetic band member 32 and the metal foil 33 are integrally formed, both the magnetic band member 32 and the metal foil 33 can be attached to the flat cable 41 all at the same time. The two magnetic band members 32 sandwiching the flat cable 41 form a closed magnetic circuit on the periphery of the flat cable 4, generate the common-mode impedance and suppress noise. Moreover, both extended sides 33a and 33b of the metal foil 33 cover the outer circumferential surface of the magnetic band member 32 without any gaps, thus a very large radiation noise inhibiting effect is achieved. Also, the metal foil 33 is electrically connected to the ground through the conductive wire 16 such that an even greater radiation noise inhibiting effect is achieved.

Moreover, the magnetic composite tape for inhibiting radiation noise according to the present invention and the radiation noise inhibiting component using the same is not limited to the above described preferred embodiments, and can be variously altered within the scope of the gist of the present invention. For example, the magnetic composite tape may be made even wider and a central portion thereof may be folded so as to sandwich the flat cable 41, though the two magnetic composite tape for inhibiting radiation noise 31 of the third preferred embodiment provided to sandwich the flat cable 41.

Figure 7:
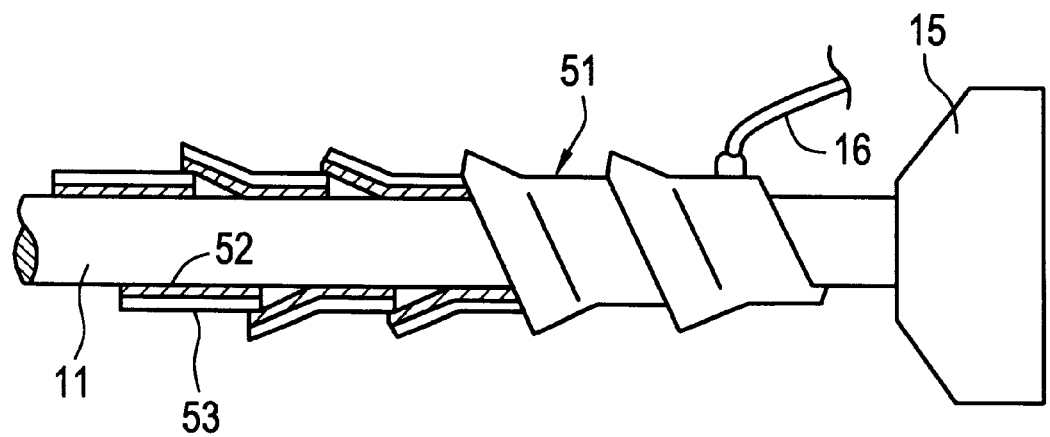
FIG. 7 is a partially cross-sectional view showing a comparative example.

The radiation noise of the radiation noise inhibiting component 18 shown in FIG. 2 of the first preferred embodiment is measured under the condition that the length of a wound portion of the composite tape 1 wound on the cable 11 is set to about 25 cm. For comparison, the cable 11 with which the composite tape is not attached (Comparative Example 1) is prepared, and further as shown in FIG. 7, the cable 11 on which the composite tape 51 including the magnetic band member 52 and the metal foil 53 having the same width as each other is wound is prepared, and the metal foil 53 is electrically connected to the ground via the conductive wire 16. The cable 11 is regarded as Comparative Example 2. The radiation noise of both cables 11 was measured.

As a result, a noise level of the first preferred embodiment is decreased more by approximately 15 dB than Comparative Example 1 at the frequency band of 200 MHz or more and decreases more by approximately 10 dB than Comparative Example 2. In spite of that the composite tape 51 on which the magnetic band member 52 and the metal foil 53 is integrally provided is wound on the cable, it was determined that the level of the noise inhibiting effect of Comparative Example 2 is low. The reasons for this are described as follows: (1) Even if the composite tape 51 is wound so that parts thereof may overlap with each other on the cable 11, the magnetic band member 52 is interposed between the sides of the metal foil 53, (i.e. a gap is formed between the sides of the metal foil 53) and the sides of the metal foil 53 are not conducted with each other. Thus, the metal foil 53 is formed in a spiral shape, which has gaps between the sides thereof, and the conduction path of the metal foil 53 becomes longer. This means the noise control of the high frequencies becomes unstable, even if the metal foil 53 is electrically connected to the ground through the conductive wire 16, since the metal foil 53 is functioning also as a coil. (2) The sides of the magnetic band member 52 wound are exposed from the gaps between the adjacent metal foils 53.

As is clear from the above explanation, according to preferred embodiments of the present invention, the magnetic member can be attached on the cable even after the connector or the like is connected to the cable. Since the magnetic composite tape for inhibiting radiation noise includes the magnetic band member and the metal foil which are integrally provided, the outer peripheral surface of the magnetic band member can be covered with the metal foil without any gaps therebetween when the magnetic band member is attached on the cable. The attaching operation is greatly simplified compared to the conventional method. The large radiation noise inhibiting effect is achieved. The radiation noise inhibiting effect is further increased by the metal foil of the magnetic composite tape provided for inhibiting radiation noise being grounded by the conductive member.

While preferred embodiments of the present invention have been disclosed, various modes of carrying out the principles disclosed herein are contemplated as being within the scope of the following claims. Therefore, it is understood that the scope of the present invention is not limited except as otherwise set forth in the claims.

What is claimed is:

1. A magnetic composite tape for inhibiting radiation noise comprising:

a magnetic band member including magnetic powders and at least one of a rubber or a flexible resin; and a metal foil having a width that is greater than a width of said magnetic band member;

wherein said metal foil is integrally provided on a first surface of said magnetic band member.

2. A magnetic composite tape according to claim 1, further comprising an adhesive film applied on a second surface of said magnetic band member.

3. A magnetic composite tape according to claim 1, wherein said metal foil is made of a metal material including at least one of copper, nickel, aluminium, and an alloy made of at least one of copper, nickel and aluminium.

4. A magnetic composite tape according to claim 1, wherein a first side of said metal foil is flush with a first side of said magnetic band member and a second side of said metal foil extends beyond a second side of said magnetic band member.

5. A magnetic composite tape according to claim 4, wherein the second side of said metal foil extends beyond the second side of said magnetic band member by about 3 mm.

6. A magnetic composite tape according to claim 1, wherein the magnetic band member is made of ferrite magnetic powders and a silicone rubber.

7. A magnetic composite tape according to claim 6, wherein the ferrite magnetic powders have a particle diameter of about 15 micrometers.

8. A magnetic composite tape according to claim 1, wherein the magnetic band member has a thickness of about 0.8 mm and a width of about 20 mm.

9. A magnetic composite tape according to claim 1, wherein the metal foil has a thickness of about 15 micrometers and a width of about 23 mm.

10. A magnetic composite tape for inhibiting radiation noise comprising:
   a magnetic band member including magnetic powders and at least one of a rubber or a flexible resin; and
   a metal foil integrally provided on a surface of said magnetic band member;
   wherein a first side of said metal foil in a width direction thereof is spaced from a first side of said magnetic band member and a second side of said metal foil extends beyond a second side of said magnetic band member.

11. A magnetic composite tape according to claim 10, further comprising an adhesive film applied on a second surface of said magnetic band member.

12. A magnetic composite tape according to claim 10, wherein said metal foil is made of a metal material including at least one of copper, nickel, aluminium, and an alloy made of at least one of copper, nickel and aluminium.

13. A magnetic composite tape according to claim 10, wherein the first side of said of said metal foil is spaced from the first side of said magnetic band member by about 3 mm.

14. A magnetic composite tape according to claim 10, wherein the second side of said metal foil extends beyond the second side of said magnetic band member by about 3 mm.

15. A magnetic composite tape according to claim 10, wherein the magnetic band member is made of ferrite magnetic powders and a silicone rubber.

16. A magnetic composite tape according to claim 15, wherein the ferrite magnetic powders have a particle diameter of about 15 micrometers.

17. A magnetic composite tape according to claim 10, wherein the magnetic band member has a thickness of about 0.8 mm and a width of about 20 mm.

18. A magnetic composite tape according to claim 10, wherein the metal foil has a thickness of about 15 micrometers and a width of about 23 mm.

19. A radiation noise inhibiting component comprising:
   a magnetic composite tape for inhibiting radiation noise including a magnetic band member having magnetic powders and at least one of a rubber or a flexible resin and a metal foil having a width that is greater than a width of said magnetic band member, wherein said metal foil is integrally provided on a surface of said magnetic band member;
   a cable covered with said magnetic composite tape along a predetermined portion of a peripheral surface of said cable; and
   a conductive member grounding said metal foil of said magnetic composite tape.

20. A radiation noise inhibiting component comprising:
   a magnetic composite tape for inhibiting radiation noise including a magnetic band member having magnetic powders and at least one of a rubber or a flexible resin and a metal foil integrally provided on a surface of said magnetic band member, wherein a first side of said metal foil in the width direction is spaced from a first side of said magnetic band member and a second side of said metal foil extends from a second side of said magnetic band member;
   a cable covered with said magnetic composite tape along a predetermined portion of a peripheral surface of said cable; and
   a conductive member grounding said metal foil of said magnetic composite tape.

* * * * *